United States Patent [19]

Kobayashi et al.

[11] 4,036,291
[45] July 19, 1977

[54] COOLING DEVICE FOR ELECTRIC DEVICE

[75] Inventors: Gai Kobayashi; Yoshiro Shikano, both of Amagasaki, Japan

[73] Assignee: Mitsubishi Denki Kabushiki Kaisha, Tokyo, Japan

[21] Appl. No.: 559,393

[22] Filed: Mar. 17, 1975

[30] Foreign Application Priority Data

Mar. 16, 1974  Japan ................................ 49-30486

[51] Int. Cl.² ............................................. H01L 23/42
[52] U.S. Cl. ...................................... 165/105; 357/82; 174/15 R
[58] Field of Search ................. 165/105, 80; 317/100; 174/15 R, 15 HP; 357/82

[56] References Cited

U.S. PATENT DOCUMENTS

| 3,609,991 | 10/1971 | Chu et al. | 165/105 X |
| 3,633,665 | 1/1972 | France et al. | 165/105 |
| 3,741,292 | 6/1973 | Aakalu et al. | 357/82 X |

Primary Examiner—Albert W. Davis, Jr.
Attorney, Agent, or Firm—Wenderoth, Lind & Ponack

[57] ABSTRACT

A semiconductor device is carried in compressive contact relationship between two vapor cooling containers put in fluid communication with condensers disposed above them through connection tubes respectively. A condensible liquid coolant fully fills each container, and the associated connection tube and partly fills the mating condenser. One auxiliary tube is disposed within each connection tube and has a bent upper end opening in the associated condenser below the liquid surface of the coolant and a lower end opening in the associated cooling container connected thereto.

7 Claims, 9 Drawing Figures

COOLING DEVICE FOR ELECTRIC DEVICE

BACKGROUND OF THE INVENTION

This invention relates to improvements in a cooling device for cooling an electric device through the utilization of a so-called vapor cooling system.

Cooling systems utilizing the phase change exhibited by condensible coolants such as FREON (trade mark) boilable and condensible adjacent to room temperature and under suitable pressures are enabled to handle heat having an extremely high thermal flux on the thermally conducting surface having a very small area with a low temperature differential. Thus such cooling systems make it possible to provide cooling devices having an excellent cooling characteristic and which are small-sized as compared with cooling systems employing coolants such as air or oils effecting no phase change. In the past, open coolant systems employing, for example, water were used to cool electric devices such as vacuum tubes, but the cooling of electric devices utilizing the phase change of condensible coolant and more particularly the boiling phenomenon thereof has been rapidly embodied in closed system cooling devices employing electrically insulating, condensible coolants such as FREON (trade mark) which have been put to practical use for electric devices having a really high capability.

Conventional vapor cooling devices have comprised a plurality of alternate heat generation elements such as semiconductor elements in compressive contact relationship with heat dissipation plates and immersed into an amount of a liquid coolant such as above described charged in a vapor cooling container. The container has been connected to fluid communication relationship with a condenser disposed thereabove through a connection tube. Heat generated by the semiconductor elements boils the liquid coolant into its vapor phase. The vaporized coolant is moved upwardly through the connection tube to enter the condenser where it is condensed into the liquid phase. Then the liquid coolant drops upon the liquid coolant within the container. Such vapor cooling devices have excellent cooling characteristics but have been disadvantageous in that upon replacing any one of the semiconductor elements, the heat dissipation blocks or their accessories by a new one, the cooling container is necessarily broken open to gain access thereto because the container, the condenser and the connection tube forms a closed coolant loop.

In order to eliminate this disadvantage, it has been already proposed to carry a semiconductor device between a pair of vapor cooling containers such as above described to maintain them in compressive contact relationship. Each of the vapor cooling containers has communicated with one condenser through an individual connection tube as above described. This measure has been disadvantageous in that with the semiconductor device having a high capability, sufficient cooling is not accomplished. This is because the condensed coolant returned to each of the vapor cooling containers is generally a very small amount so that the liquid coolant as passed through the connection tube can be carried up by the large amount of vapor coolant from the vapor cooling container ascending along the same tube. Thus the container is emptied of the liquid coolant whereupon the normal cooling operation is suspended. As a result, the liquid coolant thrown up drops into the container to again boil resulting in an intermittent cooling operation and therefore in insufficient cooling of the semiconductor device. This disadvantage can be eliminated by increasing the cross sectional area of the connection tubes, but this measure is attended by various limitations.

Accordingly it is an object of the present invention to provide a new and improved vapor cooling device for an electric device including a cooling system which is stable in operation wherein the disadvantages of the prior art as above described are eliminated by a simple construction.

SUMMARY OF THE INVENTION

A vapor cooling device is provided comprising a pair of vapor cooling containers having therebetween an electric device generating heat with the three elements in compressive contact. Each of the vapor cooling containers is filled with an amount of a condensible coolant in the form of a liquid phase capable of removing the heat from the electric device by changing the coolant from its liquid to its vapor phase. The container communicates with a condenser disposed thereabove through a connection tube. According to the principles of the present invention, the coolant in its liquid phase further fills each of the connection tubes and the associated condenser until it includes a liquid surface positioned above the junction of the connection tube and the condenser while one auxiliary tube is disposed within each of the connection tubes including a bent upper end opening in the associated condenser below the liquid surface of the coolant and a lower end opening in the associated vapor cooling container. The liquid coolant from the condenser flows downwardly through the auxiliary tube to enter the associated cooling container while the vaporized coolant ascends along the connection tube.

BRIEF DESCRIPTION OF THE DRAWINGS

The present invention will become more readily apparent from the following detailed description taken in conjunction with the accompanying drawings in which.

Throughout the Figures like reference numerals designate identical or similar components.

DESCRIPTION OF THE PREFERRED EMBODIMENTS

Figure 1:
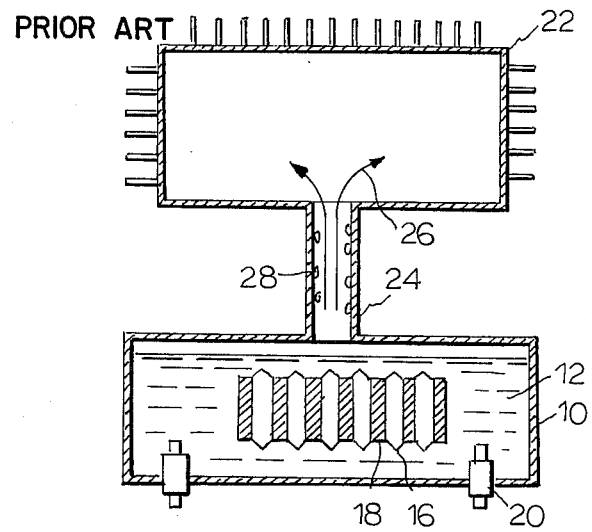
FIG. 1 is a schematic sectional view of a conventional cooling device utilizing the vapor cooling system.

Referring now to FIG. 1 of the drawings, there is schematically illustrated a conventional vapor cooling device for cooling a semiconductor device including large-scale single-crystal semiconductor elements presently put to practical use. The arrangement illustrated comprises a vapor cooling container 10 having an amount of a condensible coolant in the form of a liquid phase 12 such as FREON (trade mark) charged therein to leave a space in the upper portion thereof and a stack 14 of a plurality of semiconductor elements 16 alternating in compressive contact relationship with heat dissipation blocks 18 in the form of flat plates. The semiconductor elements and heat dissipation blocks 16 and 18 respectively are connected together into a unitary structure by means of any suitable fastening mechanism (not shown) and immersed in the liquid coolant 12. The stack 14 is electrically connected to an external electric device (not shown) through electrically insulated terminals 20 extending through and sealed in the bottom of the container 10.

A condenser 22 with heat dissipation fins is disposed above the vapor cooling container 10 and is connected to fluid communication relationship with the container 10 through a connection tube 24 to form a closed coolant loop with the container 10.

In operation each of the semiconductor elements disposed between the respective heat dissipation blocks 18 generates heat. The heat is carried away through the boiling of that portion of the liquid coolant 12 contacting the surface of each block 18. That is, that portion of the liquid coolant 12 boils into its vapor phase 26 which is, in turn, moved upwardly along the connection tube 24 until it enters the condenser 22. Within the condenser 22, the heat exchange is effected between the vapor phase 26 of the coolant and any suitable secondary coolant such as the air or water applied to the condenser 22 to condense the vapor coolant 26 into its liquid phase 28. The coolant in the liquid phase 28 thus formed drops upon the liquid coolant 12 to again serve to remove heat from the heat dissipation blocks 18 to cool the semiconductor elements.

In arrangements such as shown in FIG. 1, the electric device generating heat, in this case the semiconductor elements, is disposed within the closed coolant loop. This has resulted in a disadvantage that the replacement of the electric device leads to the necessity of breaking into the enclosed container 10 to gain access to the electric device.

Figures 2A, 2B:
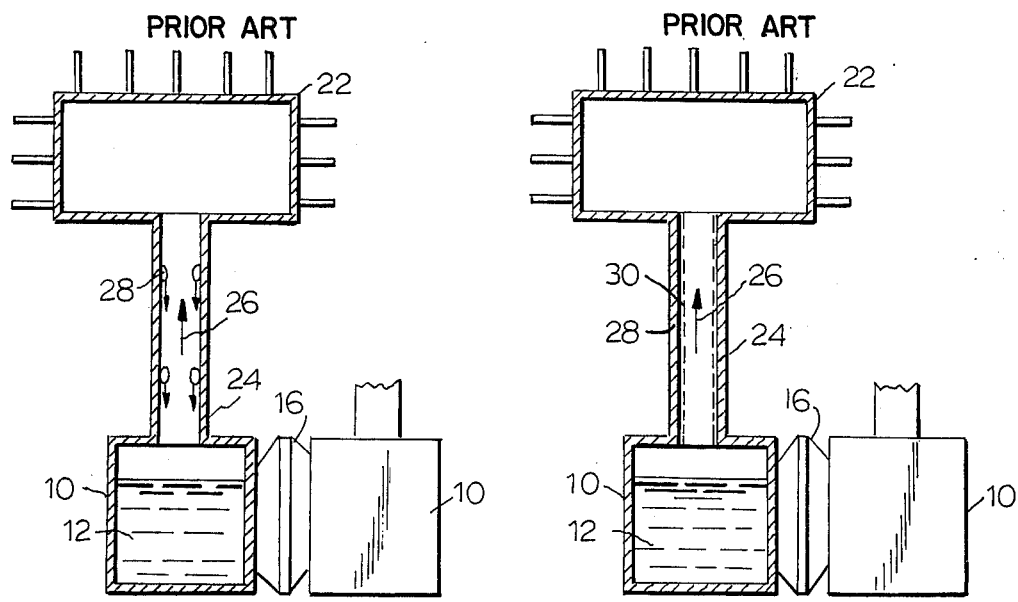
FIGS. 2a and 2b are fragmental sectional views schematically showing different conventional vapor cooling devices.

In order to avoid this objection, an arrangement has been devised to dispose a heat generation element externally of an enclosed vapor cooling container including an amount of condensible liquid coolant as shown in FIG. 2a or 2b.

In FIG. 2a, a semiconductor element 16 forming a heat generation element is carried in compressive contact relationship between a pair of vapor cooling containers 10 also serving as heat dissipation blocks such as those shown by 18 in FIG. 1. As in the arrangement of FIG. 1 each of the vapor cooling containers 10 includes an amount of a condensible liquid coolant 12 and is put in filled communication with an individual finned condenser 22 (only one of which is illustrated) through a respective connection tube 24. If desired, both containers 10 may be operatively connected to a single condenser.

Thus it will be appreciated that the arrangement of FIG. 2a is substantially similar in operation to that shown in FIG. 1.

FIG. 2b illustrates an arrangement different from that shown in FIG. 2a only in that in FIG. 2b the connection tube 24 includes an inner wall surface having a covering 30 formed of a gauze of stainless steel or a layer of suitable sintered alloy exhibiting the capillary phenomenon.

In operation, the coolant condensed into its liquid phase 28 within each condenser 22 passes through the covering 30 applied to the inner wall surface of the associated connection tube 24 due to capillary action until it is returned to the individual container 10. That is, the arrangement of FIG. 2b utilizes the heat pipe system including means for transferring a mass such as the liquid coolant, in addition to gravity. The gravity is only utilized by the arrangement as shown in FIG. 1 or 2.

Therefore the arrangement of FIG. 2b is more advantageous than that shown in FIG. 2a in that in FIG. 2b the condenser 22 is not necessarily required to be disposed above the associated vapor cooling container 10 where the liquid coolant boils. However, it is disadvantageous in that the coverings having a complicated structure are disposed in the connection tube 24. Also it is not suitable for use in handling high electric power devices because the transfer of heat in a large quantity from 1 to 2 kilowatts relies on capillary action.

In conventional cooling devices for electric devices utilizing the vapor cooling system, the electric devices having a low capacity of power do not particularly offer problems but the high capacity or power devices have the following objections: For example, assuming that as the condensible liquid coolant 12, FREON 113 (trade mark) is used to vapor cool a semiconductor element 16 generating heat in a quantity of about 1 kilowatt, the heat is applied to the liquid coolant 12 through the heat dissipation block, in this case either one of the vapor cooling containers 10, to generate the vapor phase 26 of the coolant in a large amount amounting to about 1 liter per second. This vapor phase ascends through a fine tube at an extremely high speed. On the other hand, the condensed coolant 28 is permitted to be returned to the container in an amount of about 1/200 liter per second. Therefore the condensed coolant passing through the tube will easily be blown up by the ascending vapor phase of the coolant.

In arrangements such as shown in FIG. 2, the container 15 has generally been charged with a very small amount of the liquid coolant 12 so that the amount of liquid coolant blown from the container 10 can empty the latter. At that time the normal cooling operation is suspended. As a result, the liquid coolant which has been blown upwardly falls into container 10 whereupon the boiling again occurs. This results in the air extremely unstable operation and hence in the disadvantage that sufficient cooling can not be accomplished. In order to eliminate this disadvantage, the connection tube 24 may be increased in cross sectional area which is attended with various limitations.

The present invention contemplates to eliminate the disadvantages of the prior art practices as above described by the provision of a vapor cooling device for an electric device including a cooling system which has a stable operation.

Figure 3:
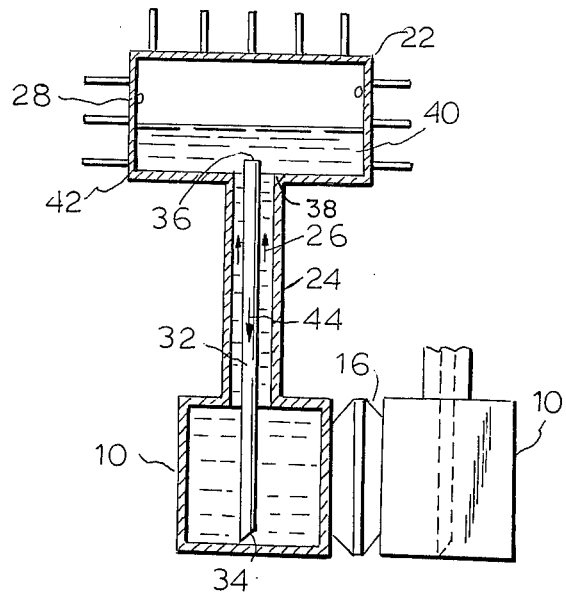
FIG. 3 is a fragmental, schematic sectional view of a vapor cooling device constructed in accordance with the principles of the present invention.

Referring now to FIG. 3, there is illustrated a vapor cooling device constructed in accordance with the principles of the present invention. The arrangement illustrated comprises an auxiliary tube 32 smaller in cross sectional area than the connection tube 24 and coaxially disposed within the latter and maintained in place by any suitable means (not shown). The auxiliary tube 24 includes a lower open end 34 bevelled and shown as substantially contacting the bottom wall surface of the associated vapor cooling container 10 and an upper open end 36 somewhat projecting from the junction 38 of the connection tube and condenser 24 and 22 respectively, in this case the upper open end of the connection tube 24, into the condenser 22. Then the coolant in its liquid phase 12 fully fills all the vapor cooling containers 10 and the connection and auxiliary tubes 24 and 32 respectively and partly fills the condenser 22 so that it includes a liquid surface 40 positioned above the upper open end 36 of the auxiliary tube 32 within the condenser 22 while leaving a substantial space in the latter. That portion of the condenser 22 filled with the liquid coolant 12, that is, extending from the bottom thereof to the liquid surface 40 is called a reservoir portion 42.

In other respects, the arrangement is identical to that shown in FIG. 2a.

In operation, the coolant disposed in each of the vapor cooling containers 10 changes from its liquid phase 12 to its vapor phase 26 due to heat generated in the semiconductor element 16 and the coolant in its vapor phase 25 is upwardly moved through the connection tube 24 into the condenser 22 as in the arrangement of FIG. 2a. Within the condenser 22, the coolant in its vapor phase is condensed into its liquid phase and then drops into the reservoir portion 42.

On the other hand, the liquid coolant 12 continuously boils within each of the coolant containers 10 while at the same time the coolant in its liquid phase 12 from the reservoir portion 42 is downwardly passed through the associated auxiliary tube 32 as shown at the arrow 44 in the FIG. 3 until it enters the individual cooling container 10 to replenish the liquid coolant in the latter.

The lower open end 34 of the auxiliary tube 32 need not substantially contact the bottom surface of the container 10. It is required only to be positioned or located below the violently boiling portion of the liquid coolant 12 within the container 10. This ensures that the vapor phase 26 of the coolant never rushes into the auxiliary tube 32. Even if the liquid coolant should boil extremely violently within the container so as to substantially entirely occupy the interior of the connection tube 24 by the vapor phase 26 thereof, the auxiliary tube 32 has a stream of liquid coolant 44 stably flowing down therethrough. This ensures that the liquid coolant is continuously and stably supplied to each container 10 through the associated auxiliary tube 32.

Figure 4:
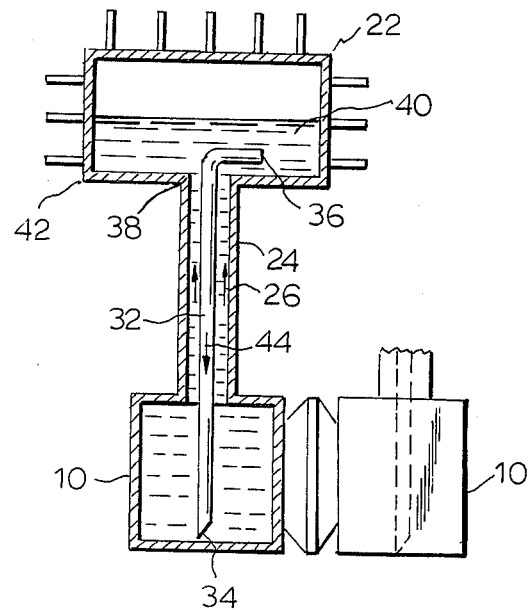
FIGS. 4 through 8 are views similar to FIG. 3 but illustrating different modifications of the present invention.

FIG. 4 shows a modification of the arrangement as illustrated in FIG. 3. As shown, the upper end portion of the auxiliary tube 32 is bent to run in a direction substantially parallel to the bottom wall of the condenser 22 and be suitably fixed for the purpose of spacing the upper end 36 thereof away from the upper open end 38 of the connection tube 24. This measure is effective for avoiding the influence of the upwardly flaming coolant in its vapor phase 26 on the inflow of the liquid coolant into the auxiliary tube 32 whereby the liquid coolant 44 can be more stably supplied to the container 10.

Figure 5:
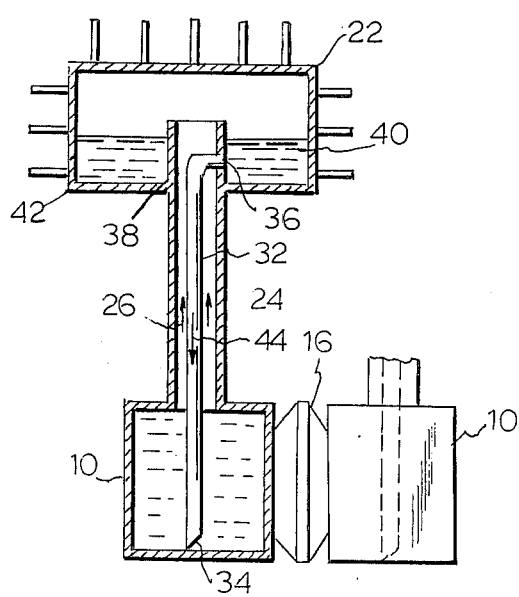

The arrangement as shown in FIG. 5 is different from that illustrated in FIG. 3 only in that in FIG. 5 the connection tube 24 has its upper end opening in the condenser 22 above the liquid surface 40 of the coolant while the auxiliary tube 32 has the upper open end 36 terminating at an aperture in the connection tube 24 located adjacent the bottom surface of the condenser 22 or the reservoir portion 42. This is effective for further improving the inflow of the liquid coolant into the auxiliary tube 32.

Figure 6:
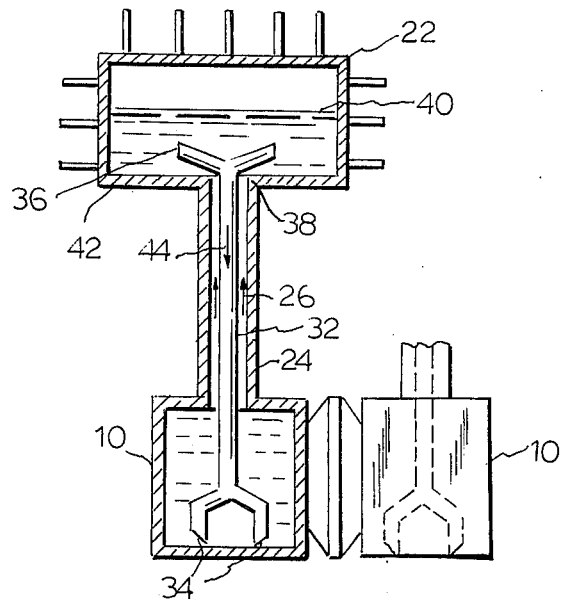

The auxiliary tube 22 include a plurality of upper open ends and/or a plurality of lower open ends. For example, FIG. 6 shows the auxiliary tube 32 having the upper and lower open ends in the form of forks.

Figure 7:
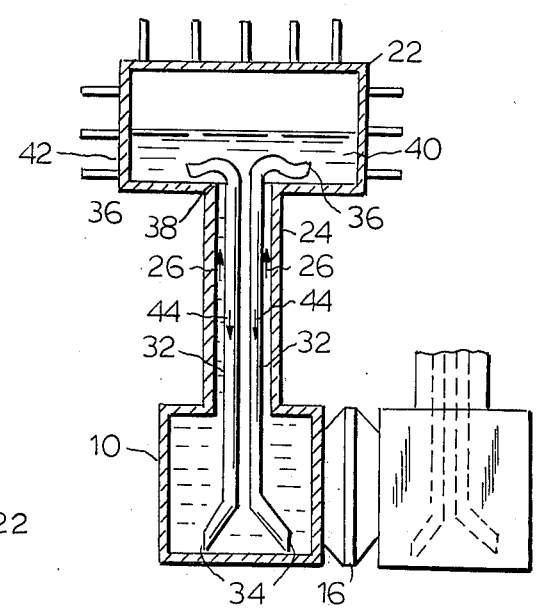

Alternatively a plurality of auxiliary tubes 32 can be inserted into the connection tube 24. For example, FIG. 7 shows a pair of auxiliary tubes 32 as illustrated in FIG. 4 disposed side by side within the connection tube 24.

Further a plurality of cooling containers can be operatively connected to a single condenser through respective connection tubes including individual auxiliary tubes. For example, FIG. 8 illustrates a pair of cooling systems formed of the cooling container 10, the connection tube 24 and the auxiliary tube 32 as shown in FIG. 4 and a single condenser 22 including the reservoir portion 44 and operatively connected to the pair of cooling systems.

Figure 8:
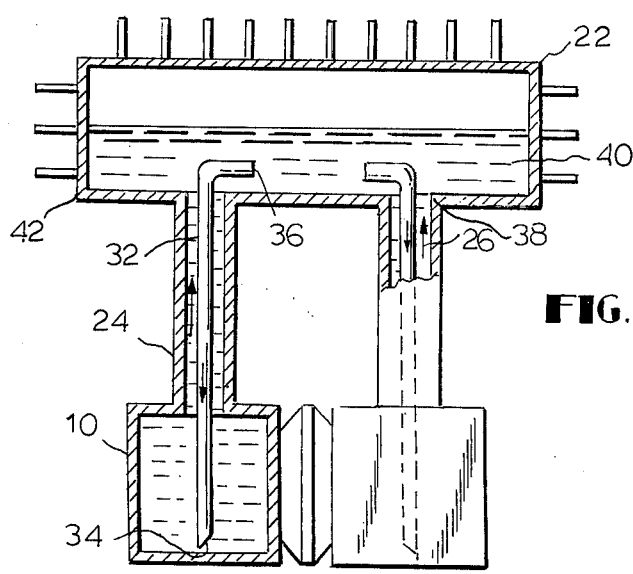

The arrangement of FIG. 8 has been experimentally tested and it has been found that the boiling and condensing characteristics are excellent.

From the foregoing it will be appreciated that the present invention has provided a vapor cooling device having excellent cooling characteristics by the stable supply of a liquid coolant to a vapor cooling container through the use of an auxiliary tube disposed within a connection tube connecting the container to a condenser located above the latter.

While the present invention has been illustrated and described in conjunction with several preferred embodiments thereof it is to be understood that numerous changes and modifications may be resorted to without departing from the spirit and scope of the present invention. For example, the present invention is equally applicable to a variety of electric devices other than semiconductor elements as far as the devices generate heat during the operation. Also the present invention may be equally applicable to electric devices disposed within the enclosed vapor cooling container 10.

What we claim is:

1. A vapor cooling device for an electric device comprising, in combination, at least one vapor cooling means having charged therein an amount of a condensible coolant in the form of a liquid phase capable of removing heat generated from an electric device by changing said coolant from its liquid phase to its vapor phase, condenser means disposed above said vapor cooling means, a connection tube member for connecting said vapor cooling means to said condenser means to put both means in fluid communication, said condenser means condensing the coolant in its vapor phase from said vapor cooling means into its liquid phase through the phase change, said coolant in its liquid phase further filling said condensor means to include a liquid surface positioned above the junction of said connection tube member and said condenser means, and at least one auxiliary tube member disposed within said connection tube member including an upper end portion extending from the junction of said connection tube member and said condenser means and bent extending laterally and opening within said condenser means below said liquid surface of said coolant and also including a lower end opening within said vapor cooling means, said vapor cooling means, said condenser means, said connection tube member and said auxiliary tube member forming a closed coolant loop.

2. A vapor cooling device as claimed in claim 1 wherein at least the upper open end of said auxiliary tube member is divided into a plurality of openings.

3. A vapor cooling device as claimed in claim 2 wherein the upper end of said auxiliary tube member is branched with each extending laterally with the end thereof spaced from the junction of said connection tube member and said condenser means.

4. A vapor cooling device as claimed in claim 1 wherein a plurality of said auxiliary tube members are disposed within said connection tube member.

5. A vapor cooling device as claimed in claim 4 wherein the upper end of each of said auxiliary tube members is bent with the open end spaced laterally of the junction of said connection tube member and said condenser means.

6. A vapor cooling device as claimed in claim 1 wherein said auxiliary tube member has an upper open end spaced laterally away from the junction of said connection tube member and said condenser means.

7. A vapor cooling device as claimed in claim 1 in which the upper end of said connecting tube member extends upwardly beyond the junction with said condenser means and above the liquid surface of the coolant, and said upper end portion of said auxiliary tube member extends laterally through the extended portion of the upper end of said connecting tube member.